US012672487B2

(12) United States Patent
Hara et al.

(10) Patent No.: US 12,672,487 B2
(45) Date of Patent: Jun. 30, 2026

(54) HIGH-PERFORMANCE PIEZOELECTRIC DEVICE WITH PIEZOELECTRIC ELEMENT

(71) Applicant: SEIKO EPSON CORPORATION, Tokyo (JP)

(72) Inventors: Toshiki Hara, Suwa (JP); Takayuki Yonemura, Suwa (JP); Jiro Kato, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1022 days.

(21) Appl. No.: 17/809,813

(22) Filed: Jun. 29, 2022

(65) Prior Publication Data

US 2023/0006128 A1 Jan. 5, 2023

(30) Foreign Application Priority Data

Jun. 30, 2021 (JP) ................................. 2021-108793

(51) Int. Cl.
| | |
|---|---|
| *H01L 41/193* | (2006.01) |
| *H01L 41/047* | (2006.01) |
| *H01L 41/45* | (2013.01) |
| *H10N 30/098* | (2023.01) |
| *H10N 30/857* | (2023.01) |
| *H10N 30/87* | (2023.01) |

(52) U.S. Cl.
CPC ......... *H10N 30/857* (2023.02); *H10N 30/098* (2023.02); *H10N 30/87* (2023.02)

(58) Field of Classification Search
CPC ..... H10N 30/098; H10N 30/87; H10N 30/857
USPC ........................................................ 310/328
See application file for complete search history.

(56) References Cited

U.S. PATENT DOCUMENTS

| | | | |
|---|---|---|---|
| 2009/0030132 A1* | 1/2009 | Kumazawa | ............ C08L 67/04 |
| | | | 524/502 |
| 2012/0025674 A1 | 2/2012 | Yoshida et al. | |
| 2014/0230573 A1 | 8/2014 | Ando et al. | |
| 2014/0347304 A1 | 11/2014 | Ando | |
| 2015/0168237 A1 | 6/2015 | Tajitsu et al. | |
| 2015/0247765 A1 | 9/2015 | Ando et al. | |

(Continued)

FOREIGN PATENT DOCUMENTS

| | | |
|---|---|---|
| JP | 2019178459 A | 10/2019 |
| WO | 2010104196 A1 | 9/2010 |

(Continued)

OTHER PUBLICATIONS

Ku Ishak Ku Marsilla et al., "Crystallization of itaconic anhydride grafted poly(lactic acid) during annealing", Journal of Applied Polymer Science 201.

(Continued)

*Primary Examiner* — Emily P Pham
*Assistant Examiner* — Monica Mata
(74) *Attorney, Agent, or Firm* — CHIP LAW GROUP

(57) ABSTRACT

A piezoelectric element includes: a piezoelectric body having a first surface and a second surface that are different from each other; a first electrode provided at the first surface; and a second electrode provided at the second surface. The piezoelectric body contains a helical chiral polymer crystal having an orientation axis as a crystal axis, the orientation axis is uniaxially oriented in a manner of intersecting both the first surface and the second surface, and a degree of orientation of the orientation axis in the piezoelectric body is 0.80 or more.

8 Claims, 11 Drawing Sheets

(56) References Cited

U.S. PATENT DOCUMENTS

| | | |
|---|---|---|
| 2016/0026299 A1 | 1/2016 | Kitada et al. |
| 2016/0198269 A1 | 7/2016 | Ando |
| 2018/0108826 A1 | 4/2018 | Tajitsu et al. |
| 2019/0003905 A1 | 1/2019 | Yoshida et al. |
| 2021/0338111 A1 | 11/2021 | Onishi |

FOREIGN PATENT DOCUMENTS

| | | |
|---|---|---|
| WO | 2013061984 A1 | 5/2013 |
| WO | 2013122070 A1 | 8/2013 |
| WO | 2013175848 A1 | 11/2013 |
| WO | 2014112494 A1 | 7/2014 |
| WO | 2014192786 A1 | 12/2014 |
| WO | 2015045993 A1 | 4/2015 |
| WO | 2015129291 A1 | 9/2015 |
| WO | 2016175321 A1 | 11/2016 |
| WO | 2020059573 A1 | 3/2020 |

OTHER PUBLICATIONS

Office Action for JP Patent Application No. JP2021108793, issued on Oct. 15, 2024 7 pages.
Jingqing Li et al., Crystalline structures and crystallization behaviors of poly(L-lactide) in poly(L-lactide)graphene nanosheet composites, Polym. Chem., 2015, 6, 3988-4002.
Kaewkan Wasanasuk et al., Crystal Structure Analysis of Poly(L-lactic Acid)α Form On the basis of the 2-Dimensional Wide-Angle Synchrotron X-ray, Macromolecules, 2011, 44, 6441-6452.
Office Action for CN Patent Application No. 202210744340.X, issued on Dec. 3, 2025, 11 pages.

* cited by examiner

START

MELTING STEP ~ S102

INJECTION STEP ~ S104

SHAPING STEP ~ S106

END

HIGH-PERFORMANCE PIEZOELECTRIC DEVICE WITH PIEZOELECTRIC ELEMENT

The present application is based on, and claims priority from JP Application Serial Number 2021-108793, filed Jun. 30, 2021, the disclosure of which is hereby incorporated by reference herein in its entirety.

BACKGROUND

1. Technical Field

The present disclosure relates to a piezoelectric element and a piezoelectric device.

2. Related Art

Since a piezoelectric polymer has a processing performance specific to a polymer material, the piezoelectric polymer is used in various forms. For example, a piezoelectric sheet made of polylactic acid generates an electrical output by a shear stress on the sheet. Therefore, such a piezoelectric sheet is considered to be applied as, for example, an input device that is provided on a screen of a smart phone and that accepts a touch input executed by a finger. However, even if the piezoelectric sheet is provided on the screen, there is not large room for the piezoelectric sheet to bend, and thus the shear stress is unlikely to be generated and a sufficient electrical output cannot be attained.

Therefore, WO2016/175321 discloses a braided piezoelectric element in which a piezoelectric fiber formed of a piezoelectric polymer is wound on a surface of a conductive fiber formed of a conductive material so that the surface is coated with the piezoelectric fiber. In such a braided piezoelectric element, the piezoelectric fiber including the piezoelectric polymer that is uniaxially oriented in a fiber axis direction is used. In addition, WO2016/175321 discloses that a winding angle of the piezoelectric fiber with respect to the conductive fiber is set to an oblique direction of 15° or more and 75° or less. By setting the winding angle to such a range, the shearing stress is likely to be generated in the piezoelectric fiber, and a large electric signal associated with a piezoelectric effect can be extracted through the conductive fiber.

However, the braided piezoelectric element has a complicated structure and is difficult to be manufactured. In addition, since the braided piezoelectric element has a special shape, it may be difficult to handle the braided piezoelectric element as a piezoelectric element.

SUMMARY

A piezoelectric element according to an application example of the present disclosure includes: a piezoelectric body having a first surface and a second surface that are different from each other; a first electrode provided at the first surface; and a second electrode provided at the second surface. The piezoelectric body contains a helical chiral polymer crystal having an orientation axis as a crystal axis, the orientation axis is uniaxially oriented in a manner of intersecting both the first surface and the second surface, and a degree of orientation of the orientation axis in the piezoelectric body is 0.80 or more.

A piezoelectric device according to an application example of the present disclosure includes the piezoelectric element according to the application example of the present disclosure.

DESCRIPTION OF EXEMPLARY EMBODIMENTS

Hereinafter, a piezoelectric element and a piezoelectric device according to the present disclosure will be described in detail with reference to accompanying drawings.

1. Piezoelectric Element

First, the piezoelectric element according to an embodiment will be described.

Figure 1:
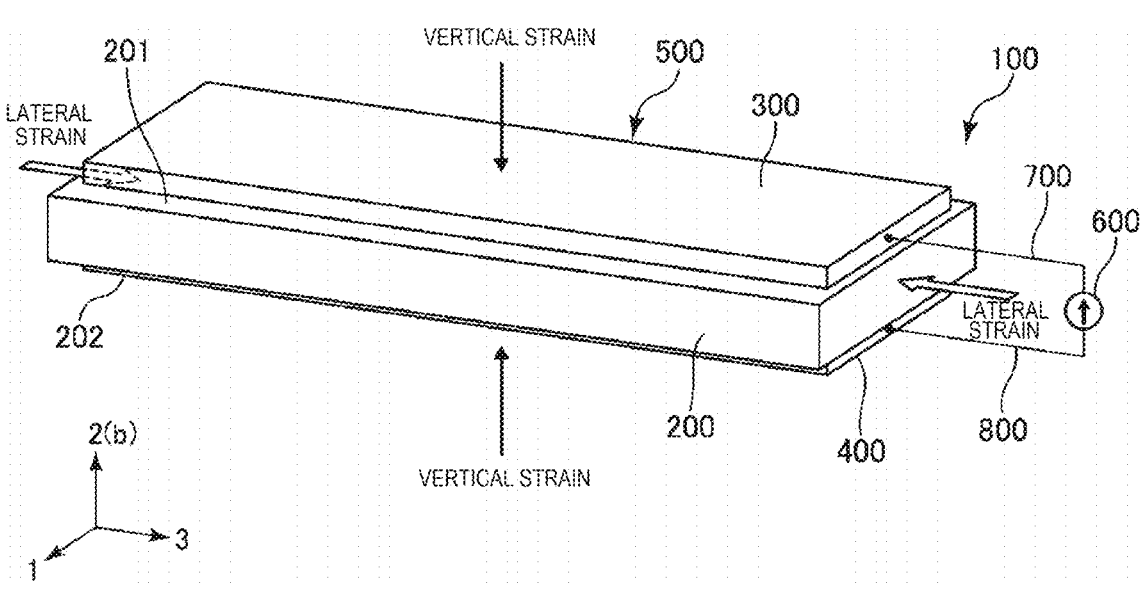
FIG. 1 is a perspective diagram illustrating a piezoelectric element according to an embodiment.

FIG. 1 is a perspective diagram illustrating the piezoelectric element according to the embodiment. In FIG. 1, a first axis 1, a second axis 2, and a third axis 3 are set as three axes orthogonal to one another.

A piezoelectric element 100 illustrated in FIG. 1 includes a laminated body 500 including a piezoelectric body 200, a first electrode 300, and a second electrode 400. The piezoelectric body 200 has a first surface 201 and a second surface 202 that have a front-to-back relationship with each other. The first surface 201 and the second surface 202 are each orthogonal to the second axis 2. Further, the first surface 201 and the second surface 202 are each parallel to a surface including the first axis 1 and the third axis 3. In the present description, "parallel" includes a state of being shifted within a range of ±10°.

The first electrode 300 is provided at the first surface 201 of the piezoelectric body 200. The second electrode 400 is provided at the second surface 202 of the piezoelectric body 200.

The piezoelectric element 100 may include a member other than these members. For example, adhesive layers or the like may be interposed between the piezoelectric body 200 and the first electrode 300 and between the piezoelectric body 200 and the second electrode 400. In addition, a protective film covering the laminated body 500, a spacer that is provided between the first electrode 300 and the second electrode 400 and that surrounds the piezoelectric body 200, and the like may be provided.

The laminated body 500 illustrated in FIG. 1 has a rectangular plate shape in plan view. The plan view shape of the laminated body 500 is not particularly limited, and may be a circle such as a perfect circle, an ellipse, or an oval, a polygon such as a quadrangle, a hexagon, or an octagon, or any other shape. In the present description, the plan view means the view from a normal line of the first surface 201 of the piezoelectric body 200.

A first wiring 700 and a second wiring 800 are coupled to the piezoelectric element 100. One end of the first wiring 700 is coupled to the first electrode 300. One end of the second wiring 800 is coupled to the second electrode 400.

The other end of the first wiring 700 and the other end of the second wiring 800 are coupled to a voltage detection device 600. In the voltage detection device 600, electric charges generated by a piezoelectric effect in the piezoelectric body 200 are taken out from the first electrode 300 and the second electrode 400, and the electric charges are converted into a voltage. Based on a voltage value thus obtained, it is possible to obtain an external force applied to the piezoelectric body 200, or to generate an electric power required for a switch operation or power generation.

The other end of the first wiring 700 and the other end of the second wiring 800 may be coupled to a power supply device (not shown) instead of the voltage detection device 600. Accordingly, a voltage can be applied between the first electrode 300 and the second electrode 400 to cause the piezoelectric body 200 to exhibit an inverse piezoelectric effect.

Examples of constituent materials of the first electrode 300 and the second electrode 400 include a simple substance of a metal element such as gold, silver, platinum, copper, nickel, aluminum, indium, tin, zinc, and palladium, or a metal material such as an alloy containing these metal elements or an intermetallic compound, and a resin material such as a conductive polymer.

An average thickness of the first electrode 300 and the second electrode 400 is not particularly limited, and is preferably 0.05 μm or more and 500 μm or less, and more preferably 0.50 μm or more and 300 μm or less.

The average thickness of the piezoelectric body 200 is not particularly limited, and is preferably 10 μm or more, more preferably 30 μm or more and 5 mm or less, and further preferably 50 μm or more and 1 mm or less. Accordingly, the piezoelectric body 200 has a sufficient piezoelectric performance.

The piezoelectric body 200 is a member containing a helical chiral polymer crystal and having a piezoelectric property. The piezoelectric body 200 is manufactured according to various methods such as an injection molding method, an extrusion molding method, and a stretching method. A helical chiral polymer is a polymer having a helical molecular structure and having a molecular optical activity. Further, the helical chiral polymer crystal refers to a crystal of such a helical chiral polymer.

Examples of the helical chiral polymer include polypeptide, cellulose derivative, polylactic acid, polypropylene oxide, and poly-β-hydroxybutyric acid. The helical chiral polymer crystal used in the present embodiment is formed of polymer chains and has a unit cell having an a axis, a b axis, and a c axis as crystal axes. According to the present embodiment, lengths of the crystal axes of the a axis, the b axis, and the c axis is b axis<a axis<c axis. In the polymer crystal, since the crystal axes parallel to a long chain direction of the polymer chain are generally long, in the present embodiment, the long chain direction of the polymer chain, that is, a helical axis in the helical structure is taken as the c axis.

Hereinafter, the polylactic acid will be described as an example of the helical chiral polymer. L-type polylactic acid (PLLA) and D-type polylactic acid (PDLA) are known as the polylactic acid having an optical activity. Hereinafter, the L-type polylactic acid, particularly stable α phase L-type polylactic acid among crystal phases of the L-type polylactic acid will be described as an example. In the following description, the α phase L-type polylactic acid is simply referred to as "polylactic acid".

Figure 2:
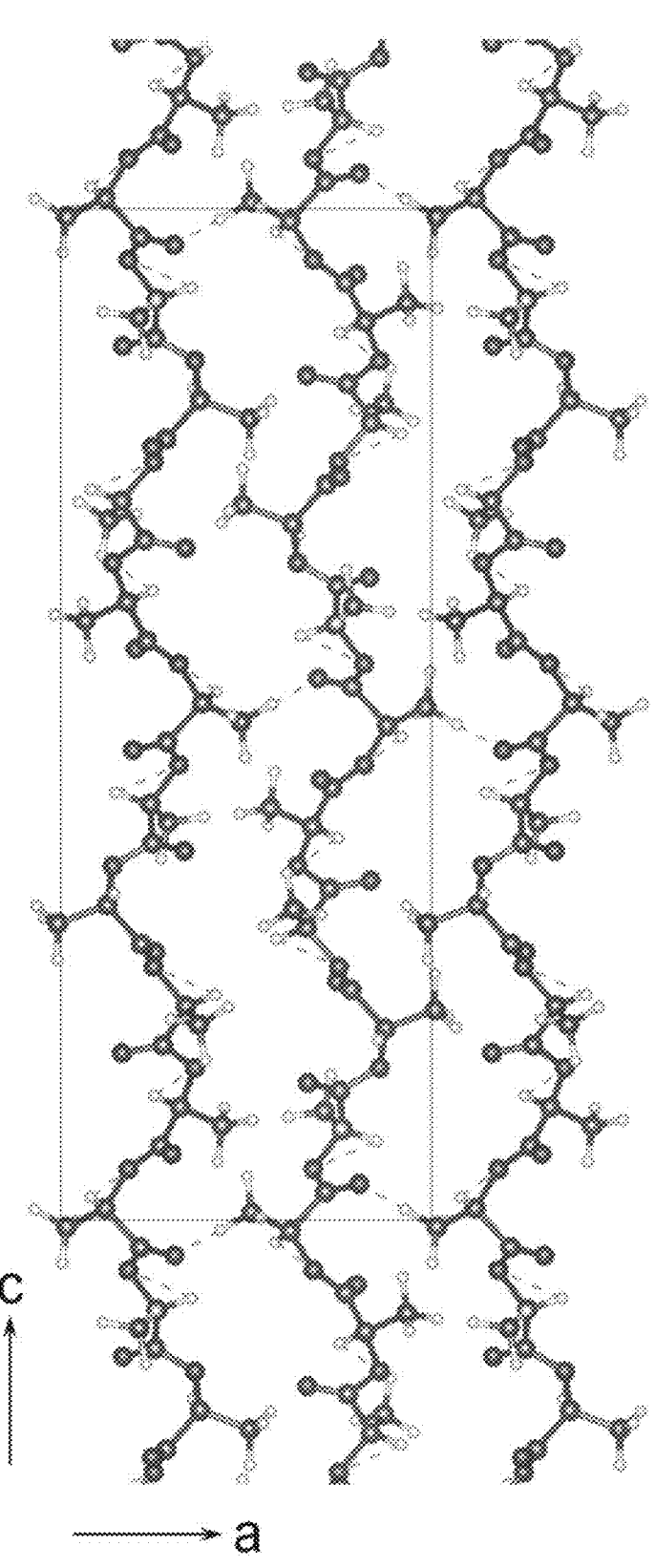
FIG. 2 is a schematic diagram illustrating a molecular structure of a polylactic acid crystal.
Figure 3:
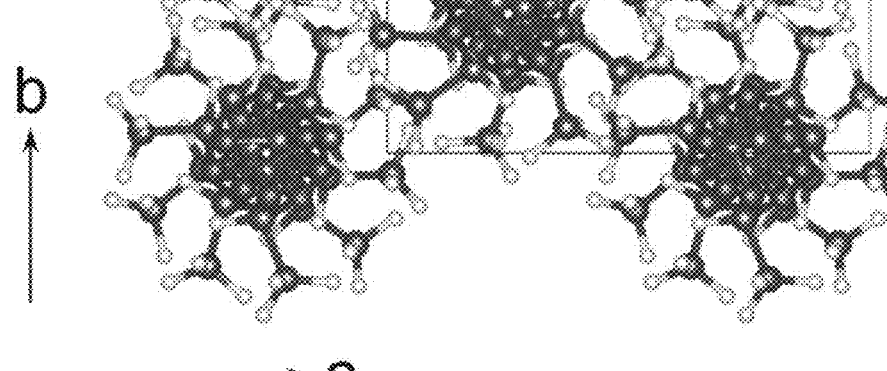
FIG. 3 is a schematic diagram illustrating a molecular structure of the polylactic acid crystal.

FIGS. 2 and 3 are schematic diagrams illustrating molecular structures of a polylactic acid crystal.

As illustrated in FIGS. 2 and 3, a molecular structure of the polylactic acid crystal has a helical structure. A crystal system of the polylactic acid crystal is a monoclinic system, and the length of the a axis of the unit cell is approximately 1.066 nm, the length of the b axis is approximately 0.616 nm, and the length of the c axis is approximately 2.888 nm. FIG. 2 illustrates a surface of the polylactic acid crystal containing the a axis and the c axis, and FIG. 3 illustrates a surface of the polylactic acid crystal containing the a axis and the b axis.

Figure 4:
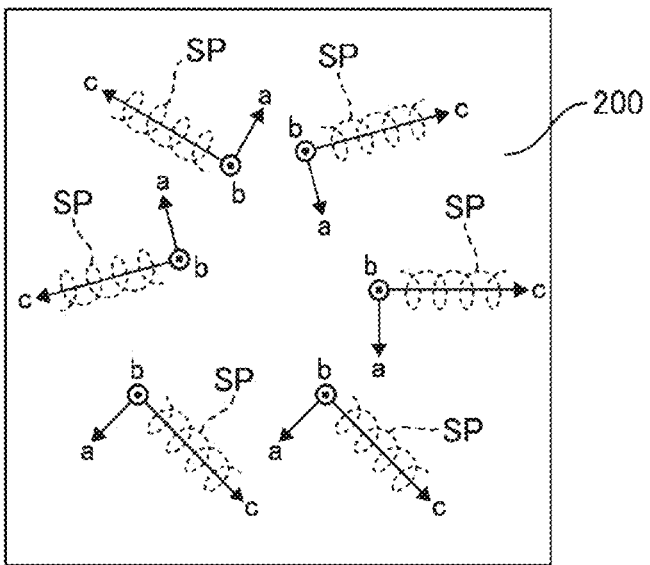
FIG. 4 is a schematic diagram of a piezoelectric body provided in the piezoelectric element illustrated in FIG. 1.
Figure 4:
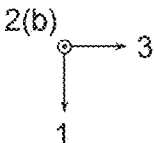

FIG. 4 is a schematic diagram of the piezoelectric body 200 provided in the piezoelectric element illustrated in FIG. 1.

The piezoelectric body 200 may contain the polylactic acid crystal, and preferably uses the polylactic acid crystal as a main material. A content of the polylactic acid crystal in the piezoelectric body 200 is preferably 30% by mass or more, more preferably 50% by mass or more, and further preferably 70% by mass or more. In addition to the polylactic acid crystal, the piezoelectric body 200 may contain, for example, polylactic acid amorphous. In addition, the piezoelectric body 200 may contain an α′ phase or a β phase L-type polylactic acid, which is a metastable phase, in addition to the α phase L-type polylactic acid, or may contain the D-type polylactic acid.

The piezoelectric body 200 according to the present embodiment contains a crystal in which the polylactic acid is oriented in the b axis. The term "b axis orientation" refers to a state in which the b axis of the polylactic acid is uniaxially oriented. That is, according to the present embodiment, the b axis is an "orientation axis". A direction in which the b axis is uniaxially oriented is a direction coupling the first electrode 300 and the second electrode 400 of the piezoelectric body 200. Therefore, the b axis is uniaxially oriented in parallel to the second axis 2. Accordingly, polarization appears in an extending direction of the second axis 2. On the other hand, according to the present embodiment, the c axis of the polylactic acid is oriented in a plane of the piezoelectric body 200.

FIG. 4 schematically illustrates the orientation state as described above. In FIG. 4, the helical structure of the polylactic acid is represented by a helical SP. An advance axis of the helical SP is parallel to the c axis. As illustrated in FIG. 4, in the piezoelectric body 200, the c axis of the polylactic acid is oriented in various directions in the plane, while the b axis is uniaxially oriented parallel to the second axis 2.

As described above, a piezoelectric constant $d_{ij}$ of the helical chiral polymer crystal whose b axis is uniaxially oriented and whose crystal system is a monoclinic system is expressed by the following equation (1) using a matrix.

$$d_{ij} = \begin{pmatrix} 0 & 0 & 0 & d_{14} & 0 & d_{16} \\ d_{21} & d_{22} & d_{21} & 0 & 0 & 0 \\ 0 & 0 & 0 & d_{16} & 0 & -d_{14} \end{pmatrix} \tag{1}$$

From the above equation (1), it can be seen that in the piezoelectric body 200, a piezoelectric vertical effect represented by a piezoelectric constant $d_{22}$ and a piezoelectric lateral effect represented by a piezoelectric constant $d_{21}$ can be used. Therefore, the piezoelectric element 100 according to the present embodiment is an element that uses at least one of the piezoelectric vertical effect represented by the piezoelectric constant $d_{22}$ and the piezoelectric lateral effect represented by the piezoelectric constant $d_{21}$.

In the helical chiral polymer crystal contained in the piezoelectric body 200, a symmetry of the molecules in the crystal is represented by a space group $P12_11$. This space group is $C_2^2$ when expressed in Schoenflies notation. According to the piezoelectric body 200 containing the helical chiral polymer crystal having such a molecular symmetry, the piezoelectric vertical effect and the piezoelectric lateral effect as described above can be effectively used. Further, in the piezoelectric vertical effect and the piezoelectric lateral effect, a direction of an applied stress is parallel or orthogonal to the direction coupling the first electrode 300 and the second electrode 400. Therefore, the piezoelectric effect or the inverse piezoelectric effect is easily used in a device or the like as compared with a piezoelectric shear effect in which the applied stress is a shear stress.

For example, when an external force is applied to the piezoelectric body 200 in a direction indicated by an arrow labeled with a vertical strain in FIG. 1, a voltage is detected in the voltage detection device 600 due to the piezoelectric vertical effect. Based on this voltage value, it is possible to detect the external force applied in the direction of the arrow labeled with the vertical strain. The piezoelectric constant $d_{22}$ is one of tensors of a piezoelectricity, and corresponds to a generated electric charge density per unit stress when the external force is applied in the direction of the arrow labeled with the vertical strain in FIG. 1 to generate a stress.

When an external force is applied to the piezoelectric body 200 in a direction indicated by an arrow labeled with a lateral strain in FIG. 1, a voltage is detected in the voltage detection device 600 due to the piezoelectric lateral effect. Based on this voltage value, it is possible to detect the external force applied in the direction of the arrow labeled with the lateral strain. The piezoelectric constant $d_{21}$ is one of the tensors of the piezoelectricity, and corresponds to a generated electric charge density per unit stress when the external force is applied in the direction of the arrow labeled with the lateral strain in FIG. 1 to generate a stress.

In the piezoelectric element 100 according to the present embodiment, a degree of orientation of the b axis in the piezoelectric body 200 is 0.80 or more. Accordingly, it is possible to increase the voltage obtained from the electric charges generated in the first electrode 300 and the second electrode 400 by the piezoelectric vertical effect and the piezoelectric lateral effect described above or the stress caused by an inverse piezoelectric vertical effect or an inverse piezoelectric lateral effect when the voltage is applied between the first electrode 300 and the second electrode 400.

The degree of orientation of the b axis in the piezoelectric body 200 is measured as follows.

First, a sample of the piezoelectric body 200 is fixed to a sample holder of an X-ray diffractometer. Then, a θ-2θ measurement is performed on the sample by X-ray diffraction, and a θ-2θ profile is obtained.

Next, an azimuth distribution intensity (a locking curve profile) is obtained for a peak of the orientation axis for which the degree of orientation is to be evaluated. An X-ray source uses a characteristic X-ray of CuKα1 having a wavelength of 1.5404 Å, and has an output tube voltage of 40 kV and an output tube current of 300 mA. In addition, a measurement range is an angle ψ in a tilt direction=−85° to 85°.

A peak derived from the orientation axis is observed in the locking curve profile. Therefore, if the degree of orientation of the orientation axis is F, the degree of orientation F is defined according to the following equation (2).

$$F=(180-\alpha)/180 \tag{2}$$

In the above equation (2), a is a half width (full width at half maximum) of the peak derived from the orientation axis in the locking curve profile.

Figure 5:
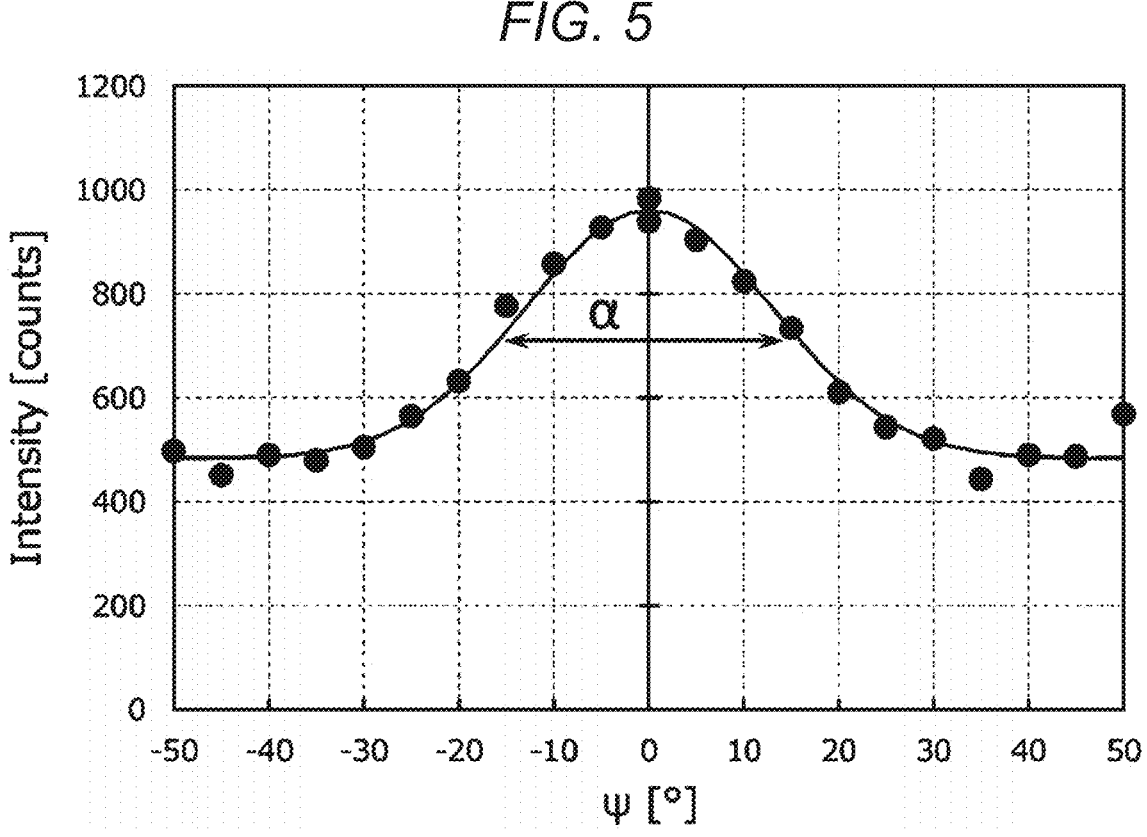
FIG. 5 is an example of a locking curve profile obtained by fixing a 2θ position to 14.7° for a piezoelectric body containing the polylactic acid crystal.

FIG. 5 is an example of the locking curve profile obtained by fixing a 2θ position to 14.7° for the piezoelectric body 200 containing the polylactic acid crystal.

In the locking curve profile illustrated in FIG. 5, the peak is observed at a position of ψ=0°. This peak is the peak derived from the orientation axis (the b axis). The half width of the peak at ψ=0° is estimated to be 30°. Therefore, the degree of orientation F of the b axis in the piezoelectric body 200 from which the locking curve profile illustrated in FIG. 5 is obtained is estimated to be 0.83 as an example.

As described above, the piezoelectric element 100 according to the present embodiment includes the piezoelectric body 200, the first electrode 300, and the second electrode 400. The piezoelectric body 200 has the first surface 201 and the second surface 202 that are different from each other. The first electrode 300 is provided at the first surface 201. The second electrode 400 is provided at the second surface 202. The piezoelectric body 200 contains the helical chiral polymer crystal having the orientation axis as the crystal axis. According to the present embodiment, the orientation axis is the b axis. The b axis is uniaxially oriented in a manner of intersecting both the first surface 201 and the second surface 202. Further, in the piezoelectric element 100 according to the present embodiment, the degree of orientation of the b axis in the piezoelectric body 200 is 0.80 or more.

According to such a configuration, since the degree of orientation of the b axis in the piezoelectric body 200 is sufficiently high, it is possible to increase the voltage obtained by the piezoelectric vertical effect or the piezoelectric lateral effect, or the stress generated by the inverse piezoelectric vertical effect or the inverse piezoelectric lateral effect when the voltage is applied. Therefore, the high-performance piezoelectric element 100 can be obtained. Further, a high-performance piezoelectric device can be obtained using such a piezoelectric element 100.

The helical chiral polymer crystal contained in the piezoelectric body 200 is preferably the polylactic acid crystal. The polylactic acid has a high piezoelectric property and a relatively high mechanical strength, and also has a good moldability. Therefore, the piezoelectric body 200 contains the polylactic acid crystal, so that the piezoelectric body 200 having excellent dimensional accuracy and durability can be obtained even in a complicated shape. As a result, a high-performance piezoelectric element 100 can be implemented.

The uniaxial orientation of the b axis in the helical chiral polymer crystal can be identified by acquiring and analyzing an X-ray diffraction profile of the piezoelectric body 200. Specifically, first, the piezoelectric body 200 is subjected to the θ-2θ measurement using the X-ray diffractometer, and the θ-2θ profile is obtained.

For example, in a case in which the b axis of the polylactic acid is uniaxially oriented, when the piezoelectric body 200 is subjected to the θ-2θ measurement by the X-ray diffraction and the θ-2θ profile is obtained, the obtained θ-2θ profile has a peak in a range in which a diffraction angle 2θ is 13.5° or more and less than 15.5°. This peak position is a peak position obtained by the θ-2θ measurement using the characteristic X-ray of CuKα1 having the wavelength of 1.5404 Å.

The θ-2θ profile has a peak in the range of 13.5° or more and less than 15.5°, and in the locking curve profile, this peak is observed at the position of ψ=0°. Accordingly, it is confirmed that the b axis of the polylactic acid is uniaxially oriented. When the b axis of the polylactic acid is uniaxially oriented, as described above, at least one of the piezoelectric vertical effect represented by the piezoelectric constant $d_{22}$ or the inverse effect thereof and the piezoelectric lateral effect represented by the piezoelectric constant $d_{21}$ or the inverse effect thereof can be used in the polylactic acid crystal. According to the piezoelectric vertical effect or the inverse effect thereof, for example, an actuator that generates a thickness vibration, a sensor that converts a stress in a direction including a component of the second axis 2 into a voltage, and the like can be implemented. According to the piezoelectric lateral effect, for example, an actuator that generates a stretching vibration, a sensor that converts a stress in a direction including a component of the first axis 1 or the third axis 3 into a voltage, and the like can be implemented. Since such a device has a high practicality in a relationship between arrangement of electrodes and the direction in which the stress is generated, the device is easy to use as compared with that when using the piezoelectric shear effect.

In particular, the polylactic acid crystal contains the helical structure and has the unit cell having the a axis, the b axis, and the c axis as the crystal axes. The lengths of the crystal axes satisfy a relationship of the b axis<the a axis<the c axis, and the c axis is parallel to the advance axis of the helical structure. In the piezoelectric body 200 provided in the piezoelectric element 100 according to the present embodiment, the orientation axis is the b axis.

According to such a configuration, in the piezoelectric body 200, at least one of the piezoelectric vertical effect represented by $d_{22}$ or the inverse effect thereof and the piezoelectric lateral effect represented by $d_{21}$ or the inverse effect thereof can be used. Accordingly, it is possible to implement the device that is easy to use.

According to the present embodiment, the orientation axis of the helical chiral polymer crystal is the b axis of the polylactic acid crystal, and the orientation axis is not limited to the b axis and may be the a axis or the c axis. That is, in the polylactic acid crystal, the a axis may be the orientation axis or the c axis may be the orientation axis. Even in such a case, although the piezoelectric constants are different, a piezoelectric element that can use the piezoelectric vertical effect or the piezoelectric lateral effect can be implemented using the first electrode 300 and the second electrode 400 described above as in the case in which the b axis is the orientation axis.

The piezoelectric body 200 is preferably an injection molded body. If the piezoelectric body 200 is the injection molded body, the piezoelectric body 200 having a desired shape can be efficiently manufactured. Therefore, a manufacturing efficiency of the piezoelectric element 100 can be improved, and a cost can be easily reduced. The injection molded body also includes a shaped body manufactured by injecting a raw material from a nozzle and depositing the raw material by a 3D printer to be described later in addition to the molded body molded by an injection molding machine.

In FIG. 4, the b axis is uniaxially oriented parallel to the second axis 2, while the c axis is plane-oriented, that is, randomly oriented in the plane of the piezoelectric body 200. The c axis may be uniaxially oriented in the plane of the piezoelectric body 200. For example, the c axis may be uniaxially oriented parallel to the third axis 3. Accordingly, the piezoelectric lateral effect represented by the above-mentioned piezoelectric constant $d_{21}$ becomes larger along the first axis 1. As a result, the higher performance piezoelectric element 100 can be implemented.

2. Piezoelectric Device

Next, a piezoelectric device according to the embodiment will be described.

FIGS. 6 to 9 are cross-sectional diagrams illustrating the piezoelectric device according to the embodiment. In FIGS. 6 to 9, an x axis, a y axis, and a z axis are set as three axes orthogonal to one another. Each axis is represented by an arrow, a tip side is "plus", and a base end side is "minus". In the following description, for example, an "x axis direction" includes both an x axis plus direction and an x axis minus direction. In addition, in the following description, a z axis plus side may be referred to as "upper" and a z axis minus side may be referred to as "lower".

Figure 6:
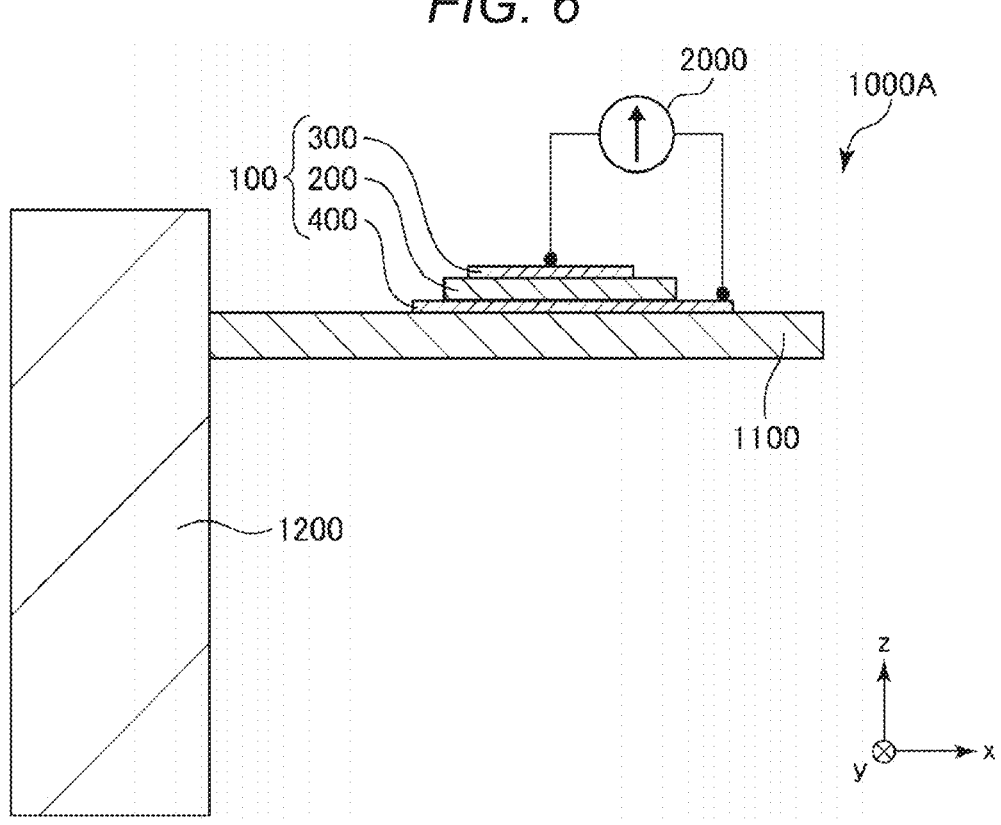
FIG. 6 is a cross-sectional diagram illustrating a piezoelectric device according to the embodiment.
Figure 7:
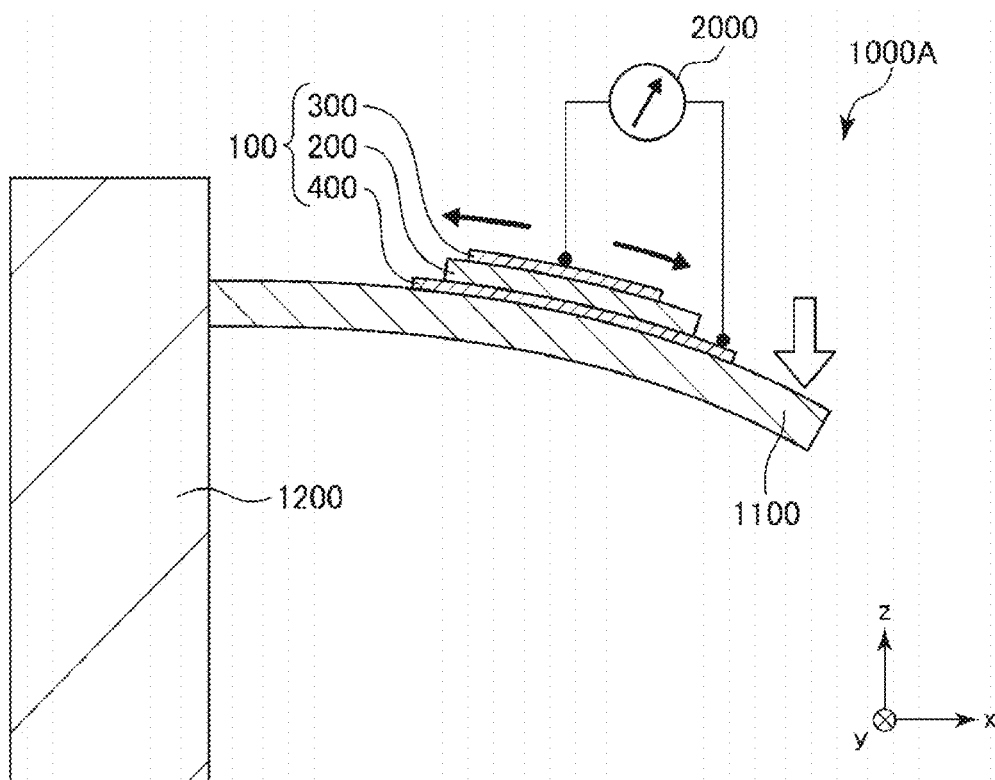
FIG. 7 is a cross-sectional diagram illustrating the piezoelectric device according to the embodiment.

A piezoelectric device 1000A illustrated in FIG. 6 and includes a substrate 1100, a support portion 1200, and the piezoelectric element 100 according to the above-described embodiment. The substrate 1100 has a long axis extending along the x axis and a short axis extending along the y axis, and has a plate shape in which a z axis direction is a thickness direction. Further, an end portion on an x axis minus side is supported by the support portion 1200. Accordingly, the substrate 1100 illustrated in FIGS. 6 and 7 is a so-called cantilever. In addition, the piezoelectric element 100 is provided at an upper surface of the substrate 1100. Further, the first electrode 300 and the second electrode 400 of the piezoelectric element 100 are coupled to a voltage detection device 2000.

When, for example, bending deformation in the z axis direction occurs in the piezoelectric device 1000A, a tensile force is applied to the piezoelectric element 100 in the x axis direction. Therefore, electric charges are generated in the first electrode 300 and the second electrode 400 due to the piezoelectric lateral effect represented by the above-described piezoelectric constant $d_{21}$. Then, the voltage detection device 2000 detects a voltage based on the electric charges generated in the first electrode 300 and the second electrode 400.

FIG. 6 illustrates a state in which no bending deformation occurs in the piezoelectric device 1000A. FIG. 7 illustrates a state in which the bending deformation occurs in the piezoelectric device 1000A.

In FIG. 6, the piezoelectric device 1000A is in a natural state. On the other hand, when an external force is applied to the piezoelectric device 1000A, the piezoelectric element 100 extends in the x axis direction as illustrated in FIG. 7. Accordingly, the voltage detection device 2000 detects the voltage. Therefore, the piezoelectric device 1000A functions as a force sensor such as a pressure sensor or a tactile sensor.

Figure 8:
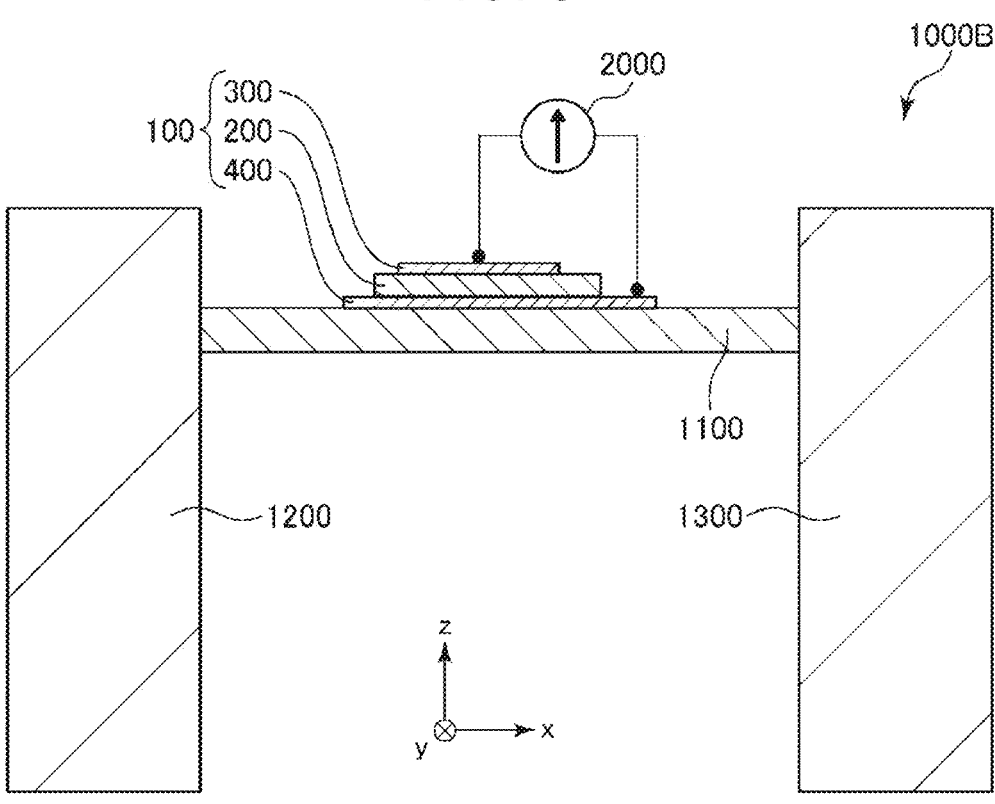
FIG. 8 is a cross-sectional diagram illustrating the piezoelectric device according to the embodiment.
Figure 9:
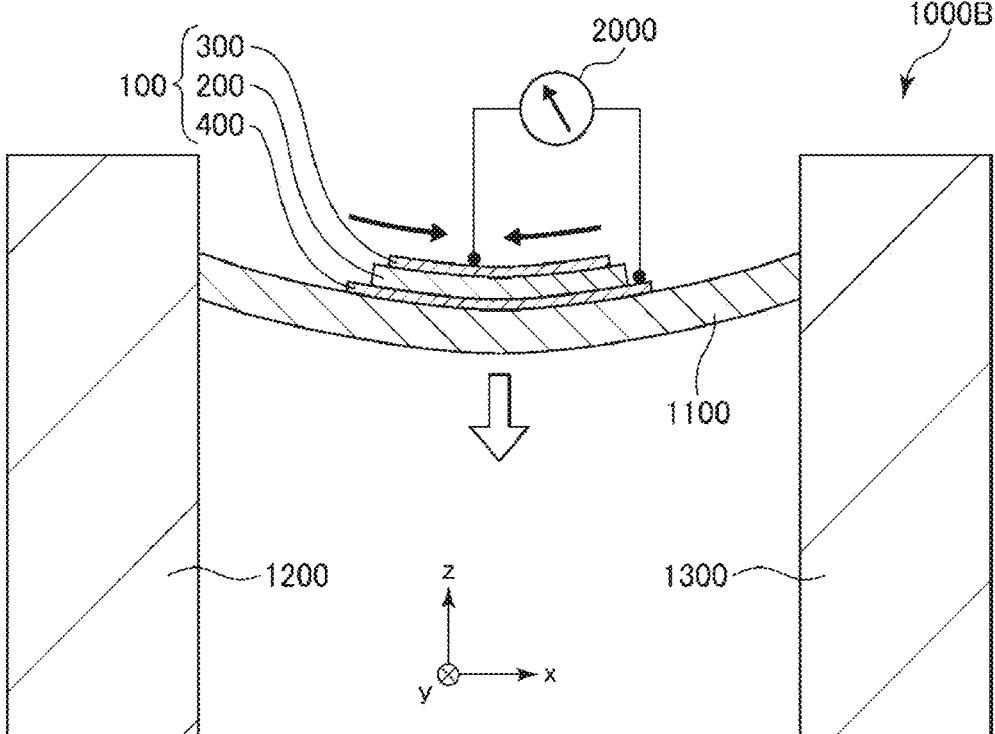
FIG. 9 is a cross-sectional diagram illustrating the piezoelectric device according to the embodiment.

A piezoelectric device 1000B illustrated in FIGS. 8 and 9 is similar to the piezoelectric device 1000A illustrated in FIGS. 6 and 7 except that the piezoelectric device 1000B further includes a support portion 1300. That is, the piezoelectric device 1000B includes the substrate 1100, the support portions 1200, 1300, and the piezoelectric element 100 according to the above-described embodiment. The end portion of the substrate 1100 on the x axis minus side is supported by the support portion 1200. The end portion of the substrate 1100 on an x axis plus side is supported by the support portion 1300. Accordingly, the substrate 1100 illustrated in FIGS. 8 and 9 is a so-called doubly-supported beam.

When the bending deformation occurs in the piezoelectric device 1000B, a tensile force is applied to the piezoelectric element 100 in the x axis direction. Therefore, the electric charges are generated in the first electrode 300 and the second electrode 400 due to the piezoelectric lateral effect represented by the above-described piezoelectric constant $d_{21}$. Then, the voltage detection device 2000 detects the voltage based on the electric charges generated in the first electrode 300 and the second electrode 400.

FIG. 8 illustrates a state in which no bending deformation occurs in the piezoelectric device 1000B. Further, FIG. 9 illustrates a state in which the bending deformation occurs in the piezoelectric device 1000B.

In FIG. 8, the piezoelectric device 1000B is in the natural state. On the other hand, when an external force is applied to the piezoelectric device 1000B, the piezoelectric element 100 contracts in the x axis direction as illustrated in FIG. 9. Accordingly, the voltage detection device 2000 detects the voltage. Therefore, the piezoelectric device 1000B functions as the force sensor such as the pressure sensor or the tactile sensor.

The piezoelectric devices 1000A and 1000B may have a unimorph structure shown in the drawings, and may have a bimorph structure. In the bimorph structure, the piezoelectric element 100 is provided not only at the upper surface of the substrate 1100 but also at a lower surface of the substrate 1100. Further, a polarization direction of the piezoelectric body 200 is set such that voltages having opposite symbols are detected at the piezoelectric element 100 provided at the upper surface and the piezoelectric element 100 provided at the lower surface. Accordingly, in the bimorph structure, it is possible to increase a voltage value detected by the voltage detecting device 2000 when the bimorph structure is displaced by the same displacement amount as compared with the unimorph structure.

Examples of the substrate 1100 include a metal plate, a ceramic plate, a silicon plate, a glass plate, and a resin plate.

The piezoelectric devices 1000A and 1000B have been described above. In addition to the device described above, examples of the piezoelectric device include various force sensors such as the tactile sensor and a force-torque sensor, various switches, a power generation element, an actuator, a vibration generation element, an ultrasonic motor, an ink jet head, a fuel injector, an atomizing device, and a micro mirror.

3. Manufacturing Device for Piezoelectric Body

Next, an example of a manufacturing device for the piezoelectric body 200 will be described.

Figure 10:
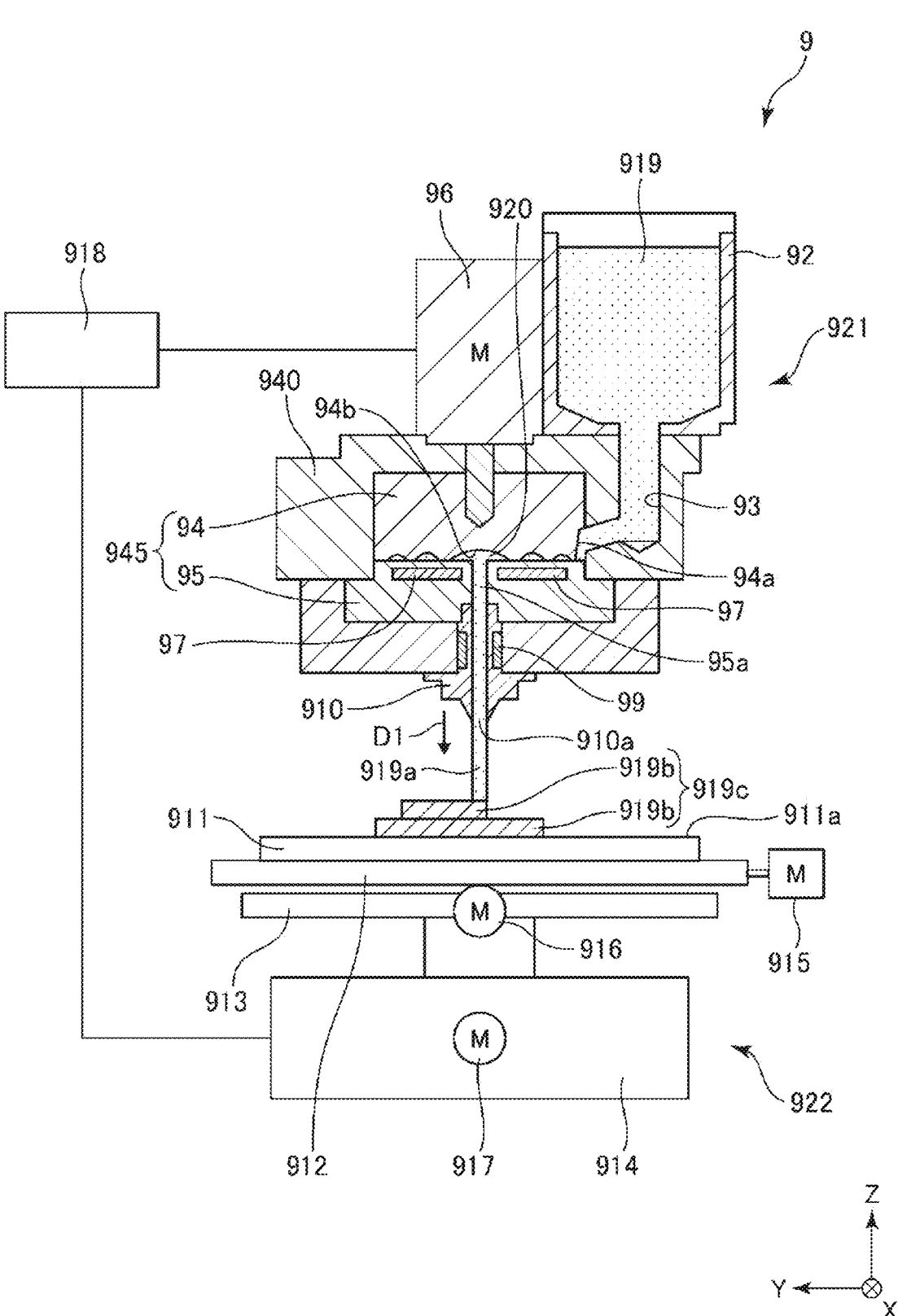
FIG. 10 is a cross-sectional diagram illustrating an example of a manufacturing device for the piezoelectric body.
Figures 11, 12:
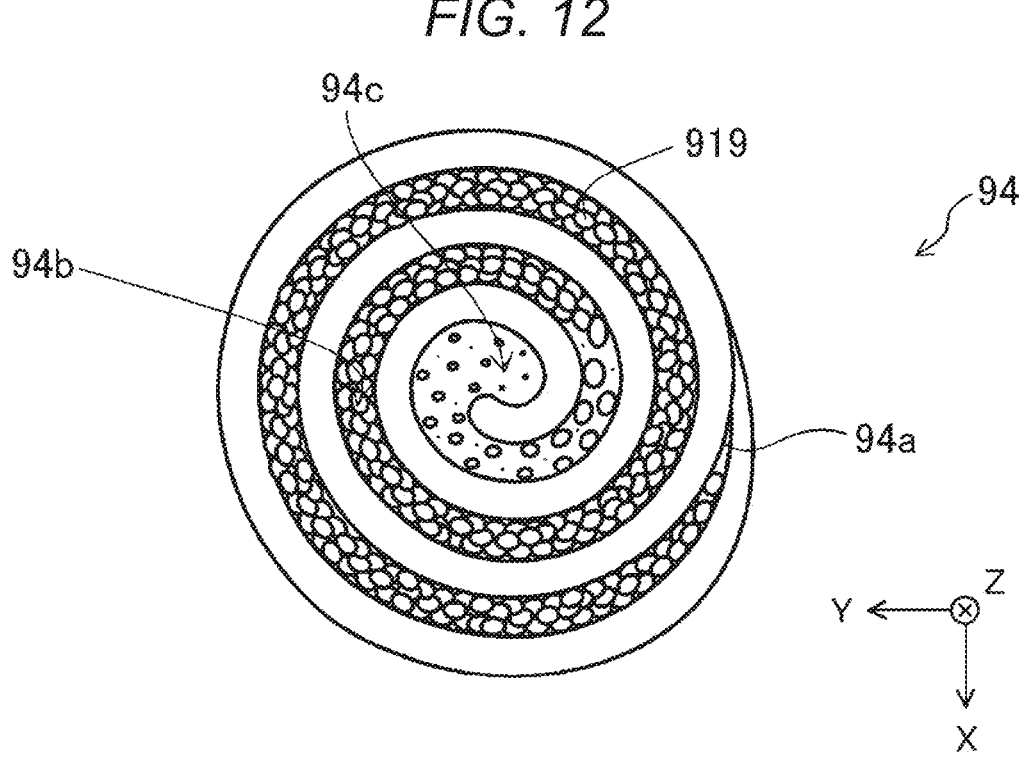
FIG. 11 is a perspective diagram illustrating a flat screw provided in the manufacturing device in FIG. 10.
FIG. 12 is a schematic diagram illustrating a state in which the flat screw in FIG. 11 is filled with a material.
Figures 13, 14:
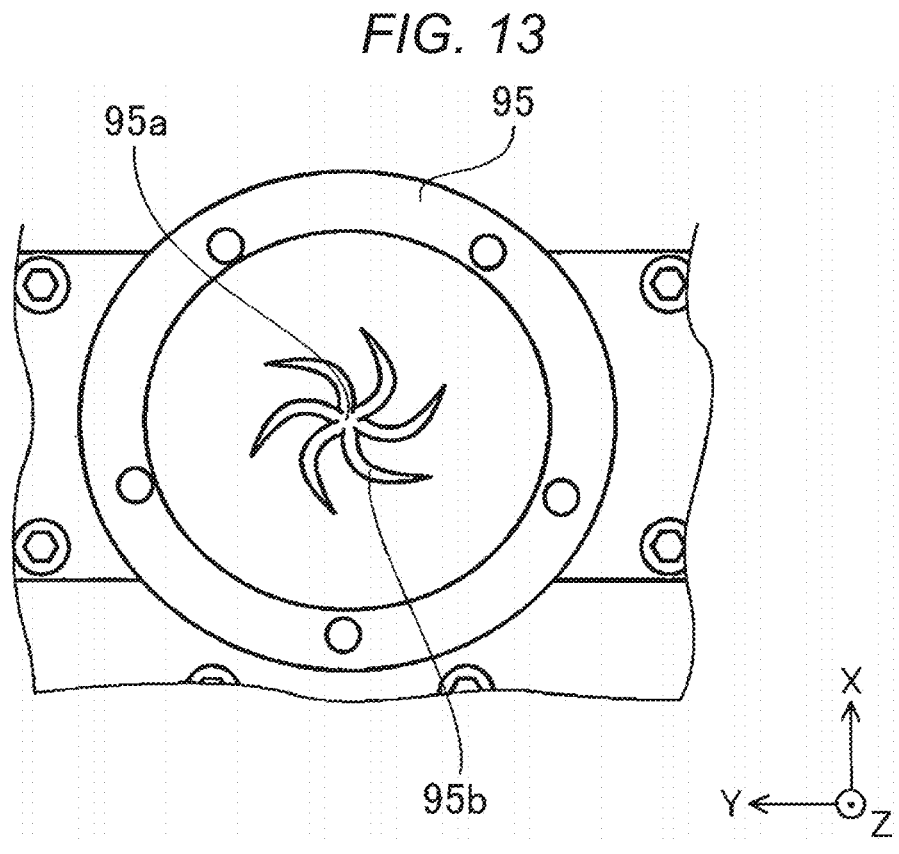
FIG. 13 is a schematic diagram illustrating a barrel provided in the manufacturing device in FIG. 10.
FIG. 14 is a flowchart illustrating a method for manufacturing the piezoelectric body.

FIG. 10 is a cross-sectional diagram illustrating an example of the manufacturing device for the piezoelectric body. FIG. 11 is a perspective diagram illustrating a flat screw provided in the manufacturing device in FIG. 10. FIG. 12 is a schematic diagram illustrating a state in which the flat screw in FIG. 11 is filled with a material. FIG. 13 is a schematic diagram illustrating a barrel provided in the manufacturing device in FIG. 10.

In FIGS. 10 to 13, an X axis, a Y axis, and a Z axis are set as three axes orthogonal to one another. Each axis is represented by an arrow, a tip side is "plus", and a base end side is "minus". In the following description, for example, an "X axis direction" includes both an X axis plus direction and an X axis minus direction. In addition, the X axis direction and a Y axis direction are directions in a horizontal plane, and a Z axis direction is a vertical direction.

A three-dimensional shaped object manufacturing device 9 illustrated in FIG. 10 is a manufacturing device for a polymer piezoelectric material injection molded body according to the embodiment, and is a so-called 3D printer. The three-dimensional shaped object manufacturing device 9 includes an injection unit 921, a stage unit 922, and a control unit 918.

The injection unit 921 heats a pellet 919, which is a raw material, to obtain a melt 919a, and injects the obtained melt 919a. The stage unit 922 receives the injected melt 919a, obtains deposits 919b, and then obtains a three-dimensional shaped object 919c by laminating the deposits 919b. The control unit 918 controls various operations of the injection unit 921 and various operations of the stage unit 922.

The injection unit 921 illustrated in FIG. 10 includes a hopper 92, a supply pipe 93, a flat screw 94, a barrel 95, a motor 96, and a nozzle 910 (injection portion).

The hopper 92 is a container that accommodates the pellet 919. The supply pipe 93 is a pipe that couples the hopper 92 and the flat screw 94.

The injection unit 921 includes a screw case 940. The flat screw 94 is accommodated in a space formed between the screw case 940 and the barrel 95. The pellet 919 accommodated in the hopper 92 is supplied to this space via the supply pipe 93.

The flat screw 94 is coupled to a rotation shaft of the motor 96 and is rotated by a power of the motor 96. In addition, as illustrated in FIGS. 11 and 12, the flat screw 94 has a helical notch 94b extending from a circumferential surface 94a to a center portion 94c. The pellet 919 supplied into the screw case 940 is compressed while moving in a space 920 formed by the notch 94b and the barrel 95 as the flat screw 94 rotates.

The barrel 95 includes a built-in heater 97. The pellet 919 compressed by the space 920 is melted (plasticized) by the heat of the heater 97 and becomes the melt 919a. Therefore, the flat screw 94 and the barrel 95 constitute a melting portion 945 that heats and melts the pellet 919.

As illustrated in FIG. 13, the barrel 95 has a communication hole 95a extending in the Z axis direction and a plurality of grooves 95b formed at a surface facing the flat screw 94. The communication hole 95a is formed at a position corresponding to the center portion 94c of the flat screw 94. In addition, the nozzle 910 is formed on a Z axis minus side of the communication hole 95*a*. The nozzle 910 has a nozzle hole 910*a*. The communication hole 95*a* is coupled to the nozzle hole 910*a*. Therefore, the melt 919*a* that moves while being pressurized to the center portion 94*c* of the flat screw 94 is injected from the nozzle hole 910*a* sequentially through the groove 95*b* and the communication hole 95*a* using the pressure as a driving force.

A heater 99 is provided in the nozzle 910. A temperature of the melt 919*a* passing through the nozzle hole 910*a* is controlled to a desired temperature by the heater 99.

The stage unit 922 illustrated in FIG. 10 includes a plate 911, a first stage 912, a second stage 913, a base portion 914, a first driving unit 915, a second driving unit 916, and a third driving unit 917.

The plate 911 has an upper surface 911*a* facing a Z axis plus side. The upper surface 911*a* is a support surface that receives the melt 919*a* injected from the nozzle hole 910*a* and causes the melt 919*a* to be deposited. Accordingly, the deposits 919*b* are obtained at the upper surface 911*a*. Then, the three-dimensional shaped object 919*c* having a desired shape is formed by laminating the deposits 919*b*. The plate 911 is mounted at the first stage 912.

The first stage 912 can move the plate 911 in the X axis direction by a power of the first driving unit 915. The first stage 912 is mounted at the second stage 913.

The second stage 913 moves the first stage 912 in the Y axis direction by a power of the second driving unit 916. Accordingly, the second stage 913 can move the plate 911 in the Y axis direction.

The base portion 914 moves the second stage 913 in the Z axis direction by a power of the third driving unit 917. Accordingly, the base portion 914 can move the plate 911 in the Z axis direction.

Therefore, the stage unit 922 functions as a so-called XYZ stage that moves the plate 911 to any position in a three-dimensional space. Therefore, by moving the plate 911, a relative position of the nozzle hole 910*a* with respect to the plate 911 can be moved without changing a position of the nozzle 910. Therefore, the melt 919*a* can be deposited three-dimensionally by moving a position of the plate 911 three-dimensionally while injecting the melt 919*a* from the nozzle hole 910*a*. As a result, the three-dimensional shaped object 919*c* having any shape can be formed.

The melting portion 945 includes the flat screw 94 as described above. The flat screw 94 efficiently compresses the pellet 919, which is the raw material. Accordingly, for example, the uniaxial orientation of the b axis of the polylactic acid is implemented with a higher degree of orientation. In addition, the flat screw 94 can efficiently knead and compress even a small number of pellets 919 in a short time as compared with other screws. Therefore, a melting time of the pellet 919 can be shortened, and deterioration of the melt 919*a* due to heating, oxidation, and the like is less likely to occur.

The flat screw 94 has many advantages for the above reasons. Alternatively, the flat screw 94 may be replaced as long as a screw has a similar effect.

An inner diameter of the nozzle hole 910*a* is not particularly limited, and is preferably 0.1 mm or more and 3.0 mm or less, and more preferably 0.2 mm or more and 0.5 mm or less. By setting the inner diameter of the nozzle hole 910*a* within the above range, a sufficient pressure can be applied to the melt 919*a* and a good kneading state can be maintained. As a result, the uniaxial orientation of the b axis of the polylactic acid in the piezoelectric body 200 can be implemented with the higher degree of orientation.

In the present embodiment, the plate 911 having the upper surface 911*a* is moved three-dimensionally. Alternatively, the nozzle 910, in other words, the injection unit 921 may be moved three-dimensionally. In addition, the plate 911 may be moved in one axis or two axes by the stage unit 922 among the three axes of the X axis, the Y axis, and the Z axis, and the nozzle 910 may be moved in the remaining axis.

The three-dimensional shaped object manufacturing device 9 is the so-called 3D printer. Alternatively, the manufacturing device for the piezoelectric body is not limited to the 3D printer, and may be, for example, an injection molding machine. The injection molding machine includes a mold having a cavity of any shape. Further, the cavity is filled with the melt 919*a* injected from the nozzle 910. Thereafter, the injection molded body is obtained by releasing the filler from the mold.

The control unit 918 illustrated in FIG. 10 is electrically coupled to the injection unit 921 and the stage unit 922. The control unit 918 controls the various operations of the injection unit 921 and the various operations of the stage unit 922 while coordinating the various operations of the injection unit 921 and the various operations of the stage unit 922 with each other.

The control unit 918 can be implemented by, for example, a computer including a processor such as a central processing unit (CPU), a memory such as a random access memory (RAM) or a read only memory (ROM), and an interface such as a universal serial bus (USB). The memory stores a program and data. The processor controls the operations of the injection unit 921 and the stage unit 922 by reading the program from the memory and executing the program.

4. Method for Manufacturing Piezoelectric Body

Next, an example of a method for manufacturing the piezoelectric body 200 will be described.

FIG. 14 is a flowchart illustrating a method for manufacturing a piezoelectric body. In the following description, a method using the three-dimensional shaped object manufacturing device 9 illustrated in FIGS. 10 to 13 will be described as an example.

The manufacturing method illustrated in FIG. 14 includes a melting step S102 of obtaining the melt 919*a*, an injection step S104 of injecting the melt 919*a*, and a shaping step S106 of obtaining the three-dimensional shaped object 919*c*. Hereinafter, the steps will be described in sequence.

4.1. Melting Step

In the melting step S102, the pellet 919 containing a helical chiral polymer is supplied to a space formed between the screw case 940 and the barrel 95. The pellet 919 is melted while moving in the space 920 formed by the flat screw 94 and the barrel 95 which are the melting portion 945, and becomes the melt 919*a*. The melt 919*a* is compressed as the flat screw 94 rotates.

4.2. Injection Step

In the injection step S104, the melt 919*a* is injected from the nozzle 910. Since the melt 919*a* is compressed by the flat screw 94, the melt 919*a* is injected by a pressure. Accordingly, the melt 919*a* is injected at a high pressure, a force pressed in an injection direction D1 is applied to the deposits 919*b* formed by depositing the melt 919*a* at the upper surface 911*a*. Therefore, when the deposit 919*b* contains, for example, polylactic acid as the helical chiral polymer, an advance axis of the helical SP of a molecular structure of the polylactic acid, that is, the longest c axis in a unit cell of the polylactic acid is oriented along the upper surface 911*a*. On the other hand, the shortest b axis in the unit cell of the polylactic acid is uniaxially oriented in a direction intersecting with the upper surface 911*a*. The three-dimensional shaped object 919*c*, that is, the piezoelectric body 200 is obtained by cooling the deposit 919*b* in a state in which the helical chiral polymer is oriented as described above.

A temperature of the nozzle 910 (the injection portion) is preferably equal to or higher than a melting point of the helical chiral polymer. Accordingly, the helical chiral polymer contained in the melt 919*a* can be maintained in a good molten state until immediately before injection. As a result, for example, the b axis of the polylactic acid is uniaxially oriented, and the piezoelectric body 200 having a high degree of orientation can be obtained.

The temperature of the nozzle 910 may be equal to or higher than the melting point of the helical chiral polymer, and is preferably set to be higher than the melting point by 10° C. or more, more preferably set to be higher than the melting point by 20° C. or more and lower than a thermal decomposition temperature of the helical chiral polymer, further preferably set to be higher than the melting point by 30° C. or more and lower than the thermal decomposition temperature by 10° C. or more.

For example, an a phase L-type polylactic acid has a melting point of approximately 182° C. and a thermal decomposition temperature of approximately 250° C. Therefore, the temperature of the nozzle 910 for injecting the melt 919*a* containing the polylactic acid is preferably set to 192° C. or more, more preferably set to 202° C. or more and less than 250° C., and further preferably set to 212° C. or more and 240° C. or less.

A temperature of the barrel 95 is not particularly limited, but is preferably in a range of ±30° C. with respect to the temperature of the nozzle 910, and more preferably in a range of ±15° C. with respect to the temperature of the nozzle 910. Accordingly, a kneading property of the flat screw 94 is improved, and finally, for example, the piezoelectric body 200 having a particularly high degree of orientation of the b axis of the polylactic acid can be manufactured.

4.3. Shaping Step

In the shaping step S106, the injected melt 919*a* is received by the upper surface 911*a* of the plate 911. Accordingly, the deposits 919*b* are obtained at the upper surface 911*a*, and the three-dimensional shaped object 919*c* is obtained by laminating the deposits 919*b*.

When the upper surface 911*a* is relatively moved in an X-Y plane with respect to the nozzle 910 while injecting the melt 919*a*, the c axis of the polylactic acid is likely to be oriented along a moving direction. Therefore, when the piezoelectric body 200 is shaped, for example, the nozzle 910 may be relatively reciprocated in the Y axis direction while being slightly displaced in the X axis direction with respect to the upper surface 911*a*. Accordingly, the piezoelectric body 200 in which the c axis of the polylactic acid is uniaxially oriented can be manufactured.

A temperature of the upper surface 911*a*, that is, a temperature of the plate 911 is preferably a temperature equal to or higher than a phase transition temperature of the helical chiral polymer and lower than the melting point. The phase transition temperature is a temperature at which phase transition from a metastable phase of the helical chiral polymer to a stable phase occurs. Accordingly, the deposit 919*b* can be cooled in a temperature range in which the phase transition to the metastable phase does not occur, that is, in a temperature range in which a phase is maintained in the stable phase. As a result, for example, the degree of orientation of the b axis of the polylactic acid can be sufficiently increased.

When the helical chiral polymer is the polylactic acid, it is particularly preferable to set the temperature of the upper surface 911*a* (support surface) according to the phase transition temperature from the metastable phase to the stable phase. Specifically, an α' phase is known as the metastable phase of the polylactic acid, and the α phase is known as the stable phase. Therefore, the temperature of the upper surface 911*a* is preferably set to be equal to or higher than the phase transition temperature at which phase transition from the α' phase to the a phase occurs and lower than the melting point of the polylactic acid. Accordingly, rapid cooling of the melt 919*a* is prevented, and generation of the metastable phase is prevented. As a result, it is possible to manufacture the piezoelectric body 200 having a high piezoelectric property and having a stable phase that is chemically stable as a main material.

The temperature of the upper surface 911*a*, that is, the temperature of the plate 911 may be equal to or higher than the phase transition temperature of the polylactic acid and lower than the melting point, and is preferably set to be higher than the phase transition temperature by 10° C. or more and lower than the melting point of the polylactic acid by 10° C. or more, and more preferably set to be higher than the phase transition temperature by 20° C. or more and lower than the melting point of the polylactic acid by 30° C. or more. Specifically, the phase transition temperature of the polylactic acid from the a' phase to the a phase is approximately 96° C. Therefore, the temperature of the plate 911 is preferably set to 106° C. or more and 172° C. or less, and more preferably set to 116° C. or more and 152° C. or less.

Although the piezoelectric element and the piezoelectric device according to the present disclosure have been described above based on the embodiment illustrated in the drawings, the piezoelectric element and the piezoelectric device according to the present disclosure are not limited to the above-described embodiment. For example, each portion according to the above-described embodiment may be replaced by any configuration having the same function, and any configuration may be added to the embodiment.

EXAMPLE

Next, a specific example of the present disclosure will be described.

5. Manufacture of Piezoelectric Body Test Piece

Example

First, as an example of a helical chiral polymer, a pellet of L-type polylactic acid (PLLA) manufactured by BMG Co., Ltd. was prepared. A melting point of the polylactic acid was 182° C., a thermal decomposition temperature was 250° C., and a phase transition temperature from an a' phase to an a phase was 96° C.

Next, the pellet of the polylactic acid was put into the three-dimensional shaped object manufacturing device illustrated in FIG. 10, a melt was injected while being folded back in a certain direction, and a piezoelectric body test piece formed of a two-layer structure deposit was obtained. The obtained piezoelectric body test piece was a circular plate having a diameter of 30 mm.

An inner diameter of a nozzle was 0.3 mm, a temperature of the nozzle was 225° C., a temperature of a barrel was 215° C., and a temperature of a plate was 120° C.

Comparative Example 1

A piezoelectric body test piece was obtained in the same manner as in the example except that a temperature of a plate was changed to 50° C.

Comparative Example 2

A piezoelectric body test piece was obtained in the same manner as in the example except that a temperature of a plate was changed to 80° C.

Comparative Example 3

A piezoelectric body test piece was obtained in the same manner as in the example except that a temperature of a plate was changed to 100° C.

6. Evaluation of Raw Material and Piezoelectric Body Test Piece 6.1. Differential Scanning Calorimetry (DSC) of Raw Material First, a DSC measurement was performed on a polylactic acid pellet of a raw material. A differential scanning calorimeter "Q1000" manufactured by TA Instruments was used for the measurement. In the DSC measurement, a melt endothermic curve was obtained while changing a temperature in three processes of a first temperature raising process, a temperature lowering process, and a second temperature raising process. Specifically, in the first temperature raising process, a temperature was raised from −20° C. to 270° C. at a temperature raising rate of 5° C./min. In the temperature lowering process, a temperature was lowered from 270° C. to −20° C. at a temperature lowering rate of 5° C./min. In the second temperature raising process, a temperature was raised from −20° C. to 270° C. at the temperature raising rate of 5° C./min.

Figure 15:
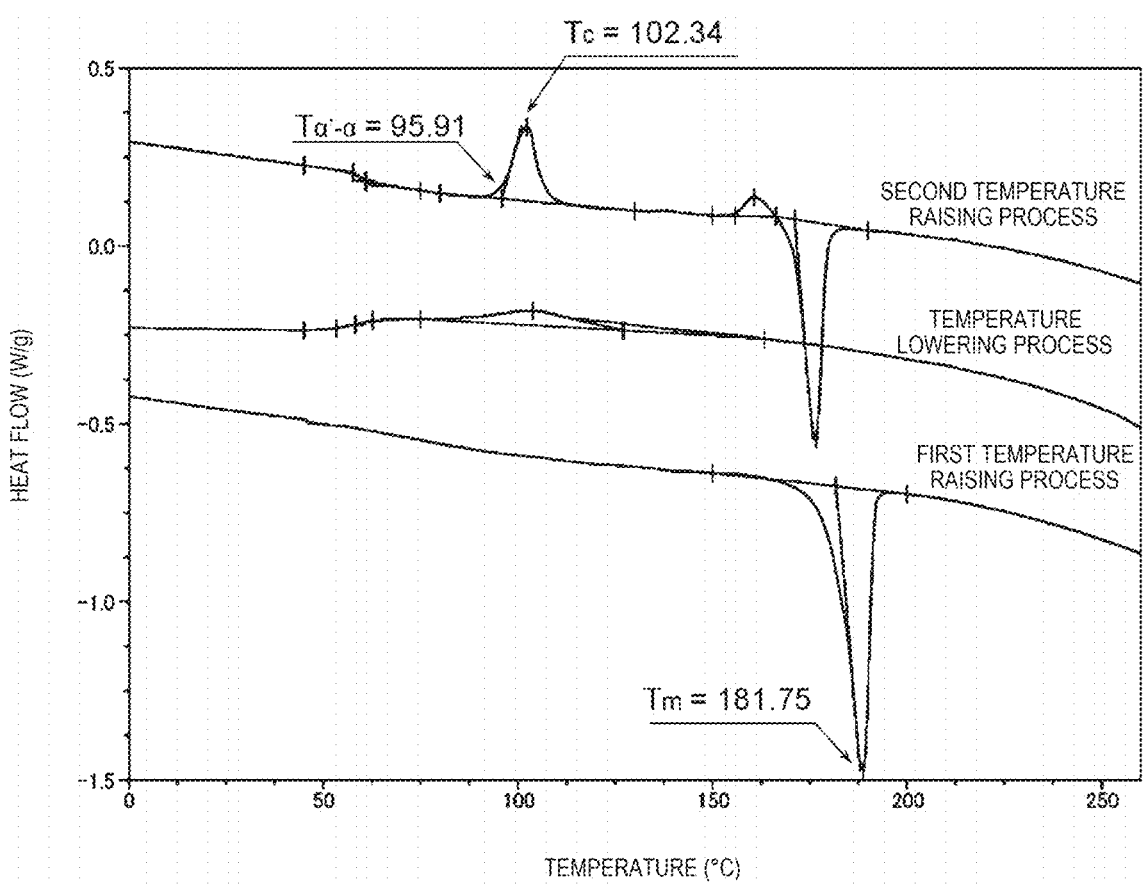
FIG. 15 is a graph illustrating a part of a melt endothermic curve obtained by a DSC measurement performed on a polylactic acid pellet of a raw material.

A part of the obtained melt endothermic curve is illustrated in FIG. 15. FIG. 15 is a graph illustrating a part of the melt endothermic curve obtained by the DSC measurement performed on the polylactic acid pellet of the raw material. As illustrated in FIG. 15, a melting point was observed at 181.75° C. in the first temperature raising process. In the second temperature raising process, a phase transition temperature from an α' phase to an a phase was observed at 95.91° C. The α' phase is a metastable phase, and the a phase is a stable phase.

6.2. X-Ray Diffraction of Piezoelectric Body Test Piece

Next, the piezoelectric body test pieces obtained according to the example and the comparative examples were subjected to a θ-2θ measurement according to a concentrated method using an X-ray diffractometer. A characteristic X-ray of CuKα1 having a wavelength of 1.5404 Å was used for X-ray diffraction.

Figure 16:
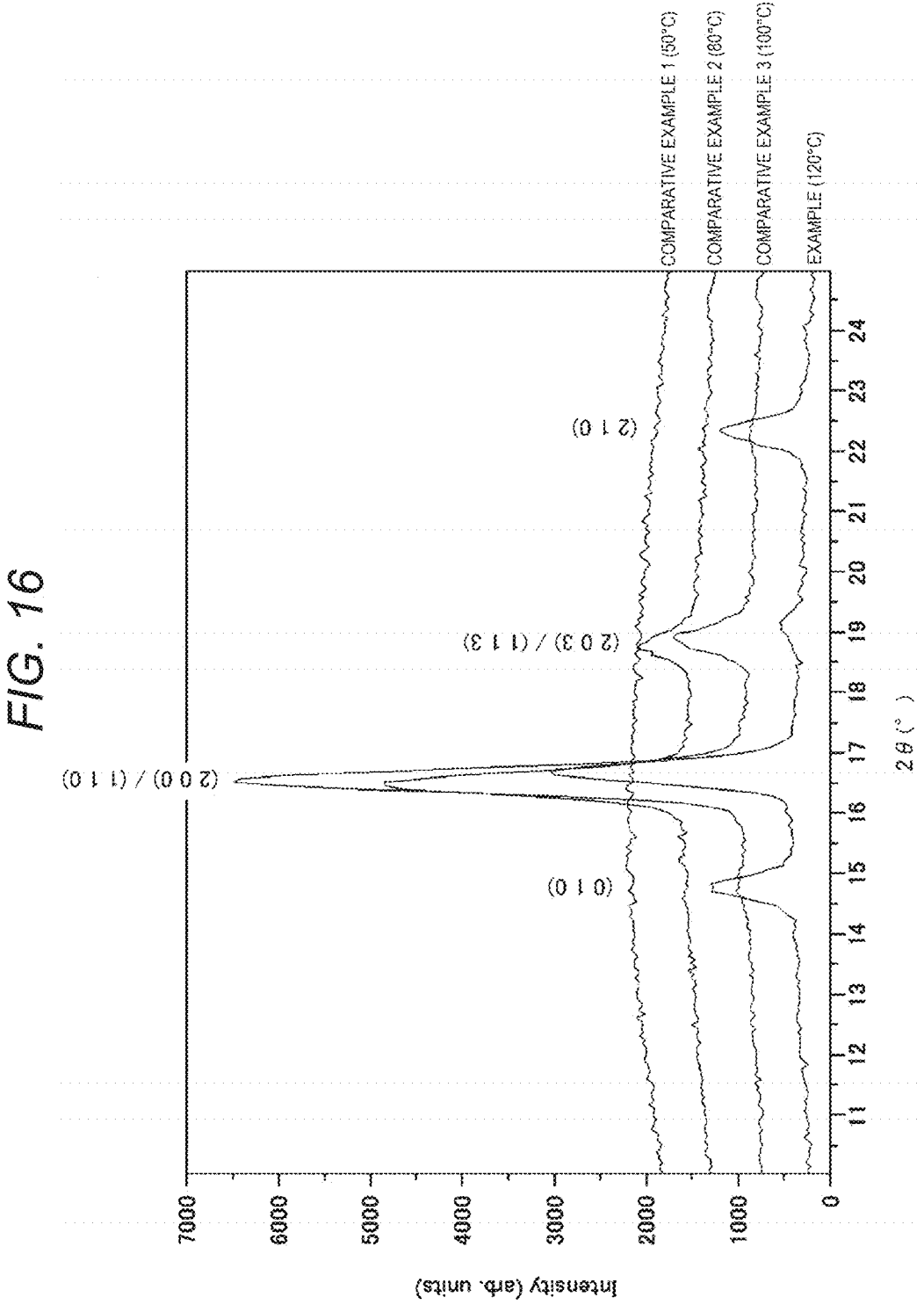
FIG. 16 is a θ-2θ profile obtained by a θ-2θ measurement for piezoelectric body test pieces obtained according to an example and comparative examples.

FIG. 16 is a θ-2θ profile obtained by the θ-2θ measurement for the piezoelectric body test pieces obtained according to the example and the comparative examples.

As illustrated in FIG. 16, no peak was observed in the θ-2θ profile obtained from the piezoelectric body test piece obtained according to Comparative Example 1. Therefore, it was found that no polylactic acid was crystallized in the piezoelectric body test piece obtained according to Comparative Example 1.

In each of the θ-2θ profiles obtained from the piezoelectric body test pieces obtained according to Comparative Examples 2 and 3, a peak was observed near 2θ=16.5°. On the other hand, a peak was also observed near 2θ=16.7° in the θ-2θ profile obtained from the piezoelectric body test piece obtained according to the example. All of these peaks are considered to be derived from a (110) plane/(200) plane.

On the other hand, in the θ-2θ profile obtained from the piezoelectric body test piece obtained according to the example, a peak was also observed near 2θ=14.7° as illustrated in FIG. 16. This peak is considered to be derived from a (010) plane corresponding to the b axis of the polylactic acid. Therefore, it was found that the piezoelectric body test piece obtained according to the example contains a crystal in which the b axis was uniaxially oriented.

For the piezoelectric body test piece obtained in the example, a locking curve profile when a 2θ position was fixed at 14.7° was obtained, and the degree of orientation of the b axis was calculated according to the above-mentioned calculation method. As a result, the degree of orientation of the b axis was 0.83.

6.3. Degree of Orientation of Piezoelectric Body Test Piece

Next, apart from the piezoelectric body test piece obtained according to the example, a piezoelectric body test piece produced in a manner of reducing a degree of orientation was prepared as Comparative Example 4. In Comparative Example 4, the piezoelectric body test piece was obtained in the same manner as in the example except that a temperature of a plate was changed to 105° C. The degree of orientation of the b axis in the piezoelectric body test piece obtained according to Comparative Example 4 was 0.75.

Next, the piezoelectric device having the unimorph structure illustrated in FIG. 6 was produced by incorporating the piezoelectric body test piece obtained according to the example and the piezoelectric body test piece obtained according to Comparative Example 4. A displacement amount when the same voltage was applied was measured.

As a result, in the piezoelectric body test piece obtained in the example, a displacement amount significantly larger than that in the piezoelectric body test piece obtained according to Comparative Example 4 was obtained.

The same test as described above was performed on the piezoelectric body test piece in which the degree of orientation of the b axis was set to 0.85 and 0.90 by increasing temperature of the nozzle. However, the displacement amount significantly larger than that in the piezoelectric body test piece obtained according to Comparative Example 4 was obtained in the same manner as that in the piezoelectric body test piece obtained according to the example.

As described above, it was clear that the piezoelectric property of the piezoelectric body can be sufficiently improved and the piezoelectric effect and the inverse piezoelectric effect can be improved by setting the degree of orientation of the b axis to 0.80 or more.

What is claimed is:

1. A piezoelectric element comprising:
a piezoelectric body having a first surface and a second surface, wherein the second surface is different from the first surface;
a first electrode provided at the first surface; and
a second electrode provided at the second surface, wherein
the piezoelectric body contains a polylactic acid crystal,
the polylactic acid crystal has a helical structure and has a unit cell having an a axis, a b axis, and a c axis as crystal axes,
lengths of the crystal axes satisfy a relationship of b axis<a axis<c axis,
the c axis is parallel to an advance axis of the helical structure, and
an orientation axis is the b axis, the orientation axis is uniaxially oriented in a manner of intersecting both the first surface and the second surface, and a degree of orientation of the orientation axis in the piezoelectric body is 0.80 or more.

2. A piezoelectric device comprising:

a substrate, a support portion, and the piezoelectric element according to claim 1.

3. The piezoelectric element according to claim 1, wherein when the piezoelectric body is subjected to a θ-2θ measurement by X-ray diffraction and a θ-2θ profile is obtained, the θ-2θ profile has a peak in a range in which a diffraction angle 2θ is 13.5° or more and less than 15.5°.

4. A piezoelectric device comprising:

a substrate, a support portion, and the piezoelectric element according to claim 3.

5. The piezoelectric element according to claim 1, wherein the piezoelectric body is an injection molded body.

6. A piezoelectric device comprising:

a substrate, a support portion, and the piezoelectric element according to claim 5.

7. The piezoelectric element according to claim 3, wherein the piezoelectric body is an injection molded body.

8. A piezoelectric device comprising:

a substrate, a support portion, and the piezoelectric element according to claim 7.

\* \* \* \* \*